June 7, 1966 R. L. SWIGGETT ET AL 3,254,559

METHOD OF MAKING PRINTED CIRCUIT PATTERNS

Filed Nov. 30, 1962 2 Sheets-Sheet 1

METHOD OF MAKING PRINTED CIRCUIT PATTERNS

Filed Nov. 30, 1962 2 Sheets-Sheet 2

United States Patent Office 3,254,559

Patented June 7, 1966

3,254,559

METHOD OF MAKING PRINTED CIRCUIT PATTERNS

Robert L. Swiggett, Huntington, Allison C. Danzig, Huntington Bay, Warren W. Wagner, Glen Cove, and Geery B. Brown, Huntington, N.Y., assignors to Photocircuits Corporation, Glen Cove, N.Y., a corporation of New York Filed Nov. 30, 1962, Ser. No. 241,391
2 Claims. (Cl. 88—24)

This invention relates to methods of making printed circuit patterns, and, more particularly, to methods of making accurate representations of patterns suitable for use in photographically reproducing the patterns on printed circuit boards to define the circuits. The term "printed circuit" is used broadly herein to refer to a circuit including one or more conductors which are, for example, printed, plated, etched or formed by chemical deposition processes on a base of insulating or other material.

Prior methods of making accurate printed circuit patterns ordinarily require manually drawing the patterns to an enlarged scale. The enlarged drawing is then photographically reduced to provide a negative film representing the pattern at the desired scale. Such methods are more time-consuming and cumbersome than is desirable for many applications.

It is an object of the present invention, therefore, to provide a new and improved method of making printed circuit patterns accurately and quickly.

In accordance with the invention, a method of making an accurate representation of a printed circuit pattern from an original inaccurate representation thereof comprises projecting to a screen through a lens an accurate reference pattern and an inaccurate representation of lands of the desired circuit pattern. The method includes the steps of applying to the screen an accurate representation of the desired pattern of lands with respect to the projected reference pattern and projecting the desired pattern of lands through the same lens substantially to the position of the original reference pattern to expose a first light-sensitive surface. The method also includes the steps of processing the light-sensitive surface to provide a positive transparency of the lands and projecting to the screen substantially from the position of the original reference pattern through the same lens the positive transparency of the lands and an inaccurate representation of the desired pattern of conductors between the lands. The method also includes the steps of applying to the screen an accurate representation of the desired pattern of conductors, projecting the desired pattern of conductors through the same lens to expose a second light-sensitive surface substantially at the reference position, and contact printing on the second light-sensitive surface the lands of the transparency.

For a better understanding of the present invention, together with other and further objects thereof, reference is made to the following description, taken in connection with the accompanying drawings, and its scope will be pointed out in the appended claims.

Referring now to the drawings.

Figure 1:
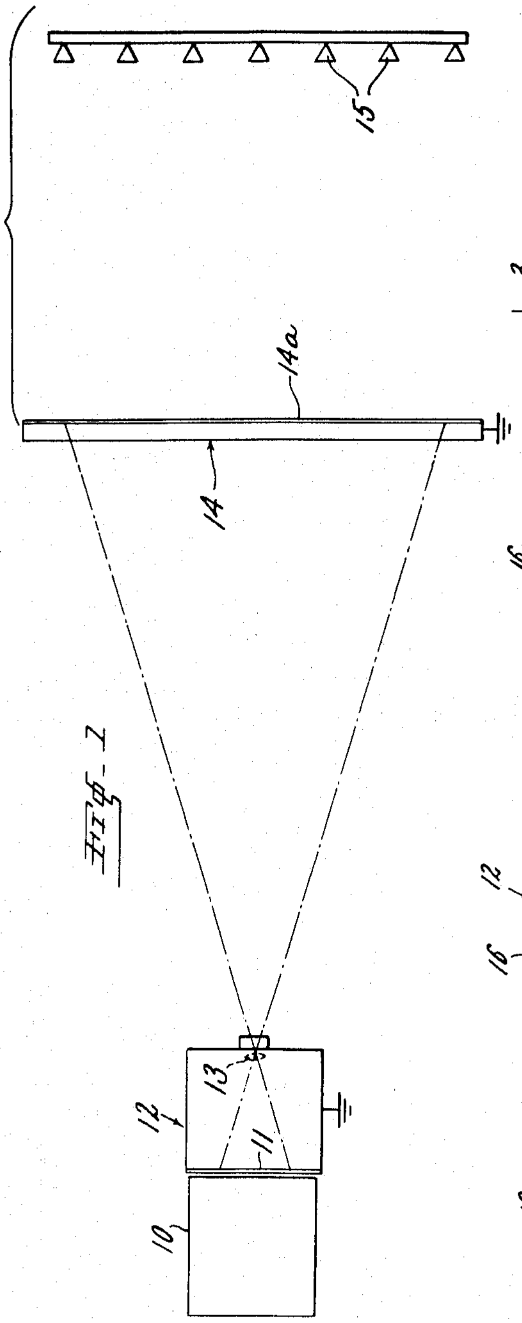
FIG. 1 is a schematic diagram of a projection system used in connection with the present invention.

Referring now more particularly to FIG. 1 of the drawings, the system there represented for use in connection with the method of the present invention comprises a set of projection lights 10 positioned to project, for example, an 8-inch by 12-inch image of object 11 in combination camera-projector 12 through lens 13 to a projection screen 14. The lens may, for example, be a commercially available 480 millimeter lens suitable for providing, for example, a 5:1 enlargement. A set of projection lights 15 is positioned to project an image together with lens 13 from the screen substantially to the position of the original object in the camera-projector. The screen preferably comprises a transparent glass plate rigidly mounted with respect to the camera-projector which preferably is also rigidly mounted. The rear face of the screen 14, comprises, for example, a translucent sheet of Mylar, which is a trademark of E. I. du Pont de Nemours and Company, Inc., for a commercially available polyester film.

Figure 2:
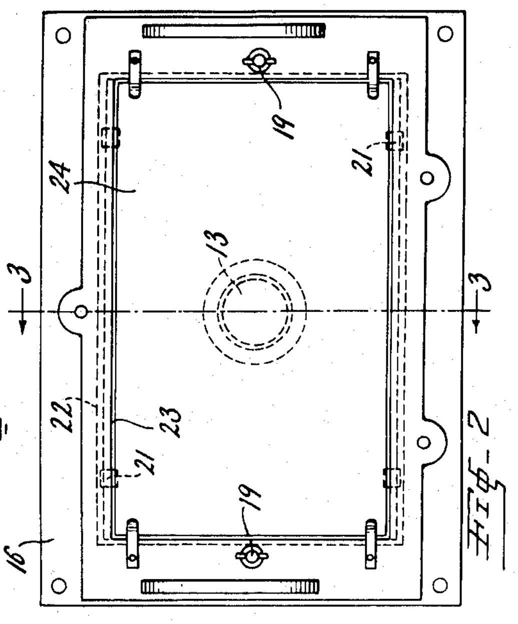
FIG. 2 is a front elevational view of a camera used in the FIG. 1 system.
Figure 3:
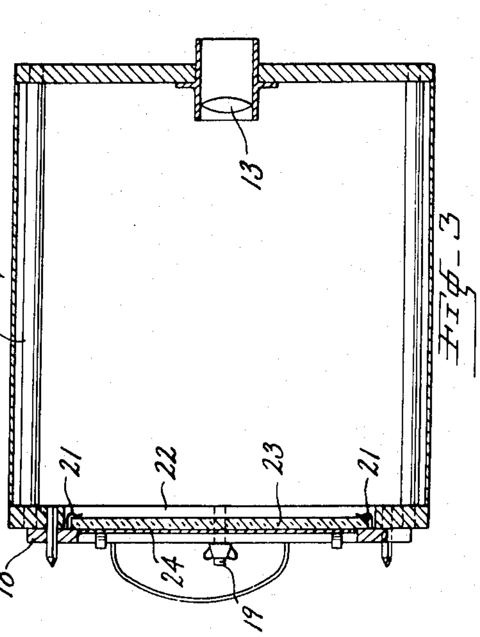
FIG. 3 is a sectional view of the FIG. 2 camera taken along line 3—3 of FIG. 2.

Referring now to FIGS. 2 and 3, the camera-projector comprises a suitable mount 16 having a projection lens 13 at one side thereof and a removable plate frame 18 at the other side. The frame 18 is positioned on the mount 16 by suitable threaded studs 19 and held by wingnuts. The face of the frame 18 disposed against the mount 16 serves as a reference plane for the patterns to be projected, as will be explained. The frame 18 has suitable clamps 21 thereon for clamping, for example, a transparent glass photographic plate to the frame 18 in aperture 22 thereof.

The method of the invention comprises the step of projecting to the screen 14 an accurate reference pattern and an inaccurate representation of the desired printed circuit pattern. The reference pattern preferably is a grid pattern of markings on a developed transparent glass photographic plate 23 (FIG. 2) clamped to the frame 18 with the grid pattern at the reference plane. The grid preferably is a rectangular pattern of .1 inch squares with .05" markings at mid-points of the squares and other reference markings as may be desired.

The inaccurate representation of the desired circuit pattern is made relatively easily and quickly by drawing the desired circuit configuration in pencil on, for example, a translucent sheet having thereon a similar grid pattern of the same size as the accurate grid pattern. However, the accuracy of the pencil drawing and of the grid pattern on which the pencil drawing is made is ordinarily considerably less than the accuracy required for the final representation of the printed circuit. Accordingly, a drawing of such accuracy is referred to herein as inaccurate. That is, the pencil drawing approximately indicates the desired position of conductors, through-connections and end connectors. Since it is inaccurate, it can be made rapidly.

Figure 4:
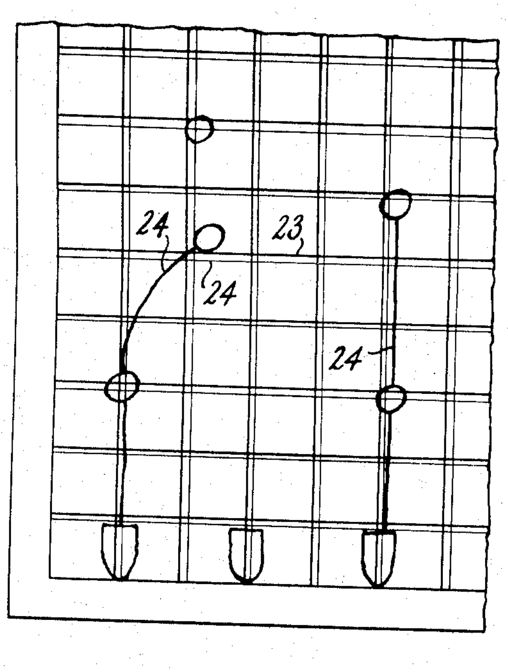
FIG. 4 is an enlarged fragmentary view of the projection screen of the FIG. 1 system with projected patterns thereon.

As indicated in FIG. 3, the pencil drawing and inaccurate grid pattern 24 is then superimposed on the accurate grid pattern 23 and clamped in position so that the accurate and inaccurate grids substantially overlap. The superimposed grid and circuit drawing are then projected to screen 14 thraugh lens 13 by illuminating projection lights 10. The marking of the accurate grid pattern 23 preferably is heavier so that the projection of the accurate grid pattern 23 is clearly distinguishable on the screen, as represented in FIG. 4. The projection of the pencil drawing and inaccurate grid pattern 24 appears on the screen, and an operator then reads the pencil indications of circuit conductors with respect to the inaccurate grid pattern. The through-connections or lands may, for example, be projected at the intersections of the inaccurate grid pattern but appear on the screen slightly displaced from the intersections of the accurate grid pattern at which the through-connections or lands of the final circuit pattern must appear.

An operator then applies to the screen an accurate representation of the desired pattern with respect to the projected accurate reference pattern which may, for example, be enlarged on the screen at a 5:1 scale with respect to the finally desired circuit pattern. Preferably the operator applies a suitable opaque adhesive tape to the translucent polyester sheet 14*a* on the screen with the tape accurately positioned with respect to the reference grid to represent the conductors. One suitable tape is a commercially available black electrical tape. The tape may be cut to desired lengths and widths and may readily be accurately applied to the screen to represent conductors 30. Areas around through-connections may be indicated by circular pads 31 or lands of black adhesive tape. Curved conductors may be easily represented by bending the tape. Because the tape is used for only a short period before it is no longer needed, distortions in the tape, such as shrinkage or creeping, which would otherwise occur over a longer period of time are eliminated and thus have no effect on the accuracy of the finally reproduced pattern.

The reference grid and rough pencil drawing of the desired pattern are then removed from the camera-projector and are replaced with a suitable light-sensitive surface such as a film or glass photographic plate with emulsion substantially at the reference plane formerly occupied by the reference grid and pencil drawings. A transparent glass supporting plate may be used to support the film if desired. The projection lights 10 are extinguished and the accurate representation of the desired circuit pattern with respect to the reference grid on the screen 14 is projected through the same lens 13 to the position of the original reference pattern by illuminating the flood lights 15 to expose the film.

Due to unavoidable limitations of accuracy in lens construction, the reference grid when projected to the screen 14 at, for example, a 5:1 enlarged scale may contain inaccuracies of the order of ±.060 inch over 60 inches exceeding the tolerance of ±.002 ordinarily required in the final printed circuit. However, by projecting the tape circuit representation on the screen through the same lens substantially to the original position of the reference pattern, any lens errors causing distortion of the reference pattern as projected to the screen are cancelled. Errors due to relative misalignments of the camera position and the plane of the screen causing distortion of the reference pattern as projected to the screen are also cancelled. Thus, the desired circuit pattern is reproduced at the reference plane accurately with respect to the original reference pattern.

The exposed film may then be processed to produce a negative and positive film, as desired, at a 1:1 size ratio to the final circuit to be printed on an insulating board.

Figure 5:
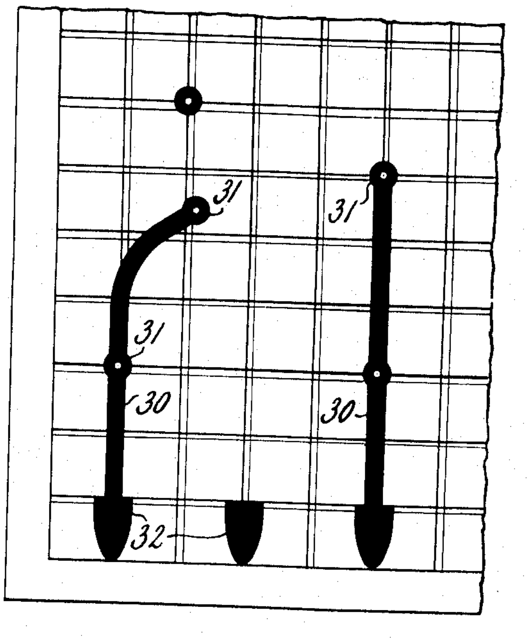
FIG. 5 is an enlarged fragmentary view of the projection screen of the FIG. 1 system with projected patterns and accurate conductor representation thereon.

In lieu of reproducing the entire circuit pattern on one face of a printed circuit board in a single exposure, any desired portion of the circuit pattern may be reproduced. For example, suitable fingers or end connections 32 (FIG. 5) may be reproduced without reproducing the remainder of the circuit by applying tape to the screen 14 to represent only the end connections 32. The pattern of end connections may thereafter be combined photographically with patterns of other circuit portions for other sides of boards of corresponding dimensions.

Also, in constructing patterns for a board having circuit patterns on both sides or patterns for a multi-layer board having through-connections extending to several circuit layers, it is necessary to provide accurate registry between the patterns of through-connections on two or more surfaces. For this purpose, the method of the present invention may be employed to project to the screen 14 an enlarged accurate reference pattern and an enlarged inaccurate representation or rough drawing of through-connections of the desired circuit pattern. The pads of black adhesive tape may then be applied to the screen 14 to provide an accurate representation of the desired pattern of through-connections or lands with respect to the projected reference pattern. A photographic plate or film is then substituted for the reference patterns in the camera-projector and the desired pattern of through-connections is then projected through the same lens 13 substantially to the position of the original reference pattern to provide a negative film of through-connections only. The reference patterns including the rough drawing of conductors of the first side of the printed circuit board are then repositioned in the camera and while the tape pads remain on the screen, the operator may then position tapes on the screen to represent the conductors of the first side. The drawing of the first side is then removed from the camera and replaced with film or photographic plate and the accurate representation of the conductors and pads of the first side are projected through the same lens to the film substantially at the original reference position. The film may then be processed to provide, for example, a suitable positive accurate representation of the first side.

A developed positive film or photographic plate transparency of the through-connections or lands only is then placed in the camera-projector substantially at the reference plane and projected with superimposed rough drawing of the conductors for the second side. The tapes representing the conductors and pads of the first side are removed from the screen. Tapes representing the conductors for the second side are then applied to the screen. The drawing and film are then removed from the camera and replaced with a film to be exposed with emulsion substantially at the reference plane. The positive film or photographic plate of through-connections only is also placed in the camera in contact substantially at the reference plane with the film to be exposed. The conductors of the second side are then projected through the same lens to the film to be exposed while the through-connections are contact printed on the same film. The film may then be developed to provide a representation of the conductors of the second side which has through-connections in accurate registry with through-connections of the first side.

From the foregoing description it will be apparent that a method of making an accurate representation of a printed circuit pattern in accordance with the invention has several advantages. The accurate pattern may be quickly and readily made at a final 1:1 ratio to the desired printed circuit pattern with accuracies of .001 inch in the final 1:1 negative. Tapes may be used to represent straight or curved conductors temporarily, within accuracy of ±.005 inch on an enlarged 5:1 scale. Such accuracy has previously been achieved only by manually drawing conductors to an enlarged scale. The method is flexible and is adapted for the reproduction of standard circuit portions such as end connectors and through-connections. The method is also adapted for use in the construction of accurately registered multi-side patterns. Any method of making a suitable pattern on the screen, for example, drawn with ink, spraying through stencils, cutting away strippable film, pasting cutouts or prepared photographic images, may be used. For some applications, the opaque portion of the representation of the pattern may correspond to the region between conductors, while the conductors are represented by a translucent or transparent regions.

While there have been described what are at present believed to be of the preferred embodiments of this invention, it will be obvious to those skilled in the art that various changes and modifications may be made therein without departing from the invention, and it is, therefore, aimed to cover all such changes and modifications as fall within the true spirit and scope of the invention.

Having thus described our invention, what we claim and desire to protect by Letters Patent is:

1. The method of making an accurate representation of a printed circuit pattern from an original inaccurate representation thereof comprising projecting to a screen through a lens an accurate reference pattern and an inaccurate representation of lands of the desired printed circuit pattern; applying to the screen an accurate representation of the desired pattern of lands with respect to the projected reference pattern; projecting the desired pattern of lands through the same lens substantially to the position of the original reference pattern to expose a first light-sensitive surface; processing the light-sensitive surface to provide a positive transparency of the lands; projecting to the screen substantially from the position of the original reference pattern through the same lens the positive transparency of the lands and an inaccurate representation of the desired pattern of conductors between the lands; applying to the screen an accurate representation of the desired pattern of conductors; projecting the desired pattern of conductors through the same lens to expose a second light-sensitive surface substantially at the reference position; and contact printing on the second light-sensitive surface the lands of the transparency.

2. The method of making accurate representations of printed circuit patterns for a multi-sided board from original inaccurate representations thereof comprising projecting to a screen through a lens an accurate reference pattern and an inaccurate representation of the first desired printed circuit pattern including the lands thereof; applying to the screen an accurate representation of the desired pattern of lands with respect to the projected reference pattern; projecting the first desired pattern of lands through the same lens substantially to the position of the original reference pattern to expose a first light-sensitive surface; projecting to the screen the accurate reference pattern and the inaccurate representation of the first desired printed circuit pattern; applying to the screen an accurate representation of the conductors of the first desired pattern; projecting the first desired pattern of lands and conductors through the same lens to the position of the original reference pattern to expose a second light-sensitive surface; processing the first light-sensitive surface to provide a positive transparency of the lands; projecting to the screen from the position of the original reference pattern through the same lens the positive transparency of the lands and an inaccurate representation of a second desired pattern of conductors between the lands; applying to the screen an accurate representation of the second desired pattern of conductors; projecting the second desired pattern of conductors through the same lens to expose a third light-sensitive surface substantially at the reference position; and contact printing on the third light-sensitive surface the lands of the transparency.

References Cited by the Examiner

UNITED STATES PATENTS

| | | | |
|---|---|---|---|
| 2,382,988 | 8/1945 | Garraway | 95—74 X |
| 2,752,245 | 6/1956 | Hough et al. | 95—85 X |
| 3,041,930 | 7/1962 | Davidson | 88—24 |

NORTON ANSHER, *Primary Examiner.*